United States Patent
Lofgreen et al.

(10) Patent No.: US 11,551,994 B2
(45) Date of Patent: Jan. 10, 2023

(54) LIQUID METAL TIM WITH STIM-LIKE PERFORMANCE WITH NO BSM AND BGA COMPATIBLE

(71) Applicant: Intel Corporation, Santa Clara, CA (US)

(72) Inventors: Kelly Lofgreen, Phoenix, AZ (US); Chia-Pin Chiu, Tempe, AZ (US); Joseph Petrini, Gilbert, AZ (US); Edvin Cetegen, Chandler, AZ (US); Betsegaw Gebrehiwot, Chandler, AZ (US); Feras Eid, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 962 days.

(21) Appl. No.: 16/139,401

(22) Filed: Sep. 24, 2018

(65) Prior Publication Data

US 2020/0098661 A1    Mar. 26, 2020

(51) Int. Cl.
*H01L 23/373* (2006.01)
*H01L 23/367* (2006.01)
*H01L 23/00* (2006.01)

(52) U.S. Cl.
CPC ........ *H01L 23/3736* (2013.01); *H01L 23/367* (2013.01); *H01L 24/09* (2013.01); *H01L 2924/014* (2013.01)

(58) Field of Classification Search
CPC ... H01L 23/10; H01L 23/367; H01L 23/3675; H01L 23/3736; H01L 23/42; H01L 23/433; H01L 24/09
See application file for complete search history.

(56) References Cited

U.S. PATENT DOCUMENTS

| | | | | |
|---|---|---|---|---|
| 6,656,770 | B2 * | 12/2003 | Atwood | H01L 23/4275 257/713 |
| 2006/0033205 | A1 * | 2/2006 | Sauciuc | H01L 23/473 257/E23.098 |
| 2006/0113105 | A1 * | 6/2006 | Kubo | H01L 23/3675 257/E23.09 |
| 2006/0120051 | A1 * | 6/2006 | Macris | H01L 24/32 257/E23.137 |
| 2007/0238282 | A1 * | 10/2007 | Furman | H01L 21/4882 438/612 |

OTHER PUBLICATIONS

WikipediA, Mercury (element), obtained Mar. 7, 2022, pp. 1-2 (Year: 2022).*

* cited by examiner

*Primary Examiner* — Allan R Wilson
(74) *Attorney, Agent, or Firm* — Schwabe, Williamson & Wyatt, P.C.

(57) ABSTRACT

Embodiments include an electronic system and methods of forming an electronic system. In an embodiment, the electronic system may include a package substrate and a die coupled to the package substrate. In an embodiment, the electronic system may also include an integrated heat spreader (IHS) that is coupled to the package substrate. In an embodiment the electronic system may further comprise a thermal interface pad between the IHS and the die. In an embodiment the die is thermally coupled to the IHS by a liquid metal thermal interface material (TIM) that contacts the thermal interface pad.

22 Claims, 13 Drawing Sheets

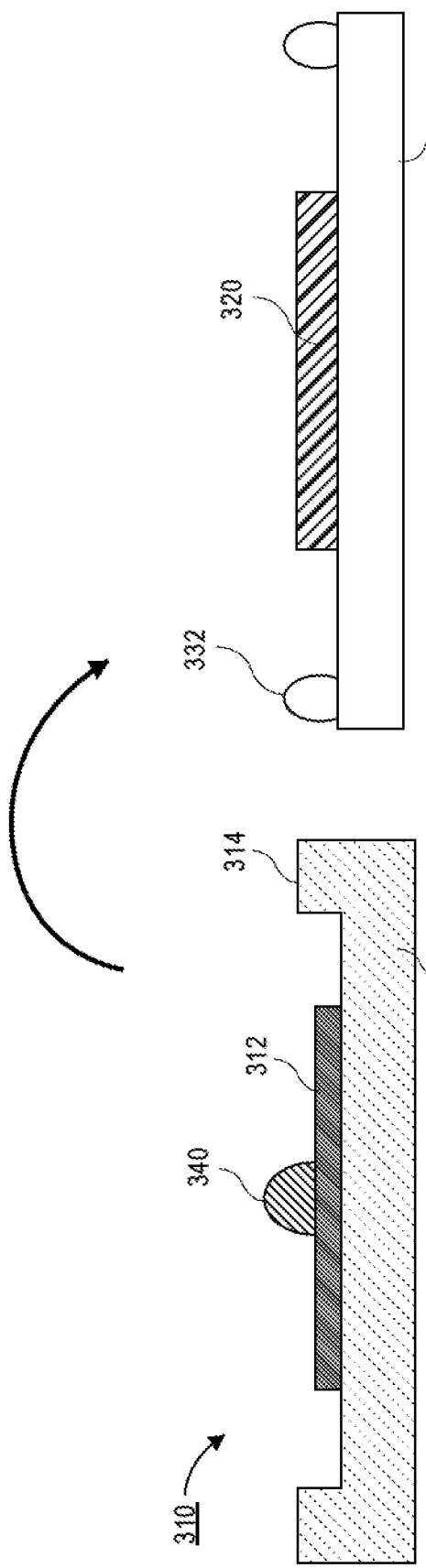
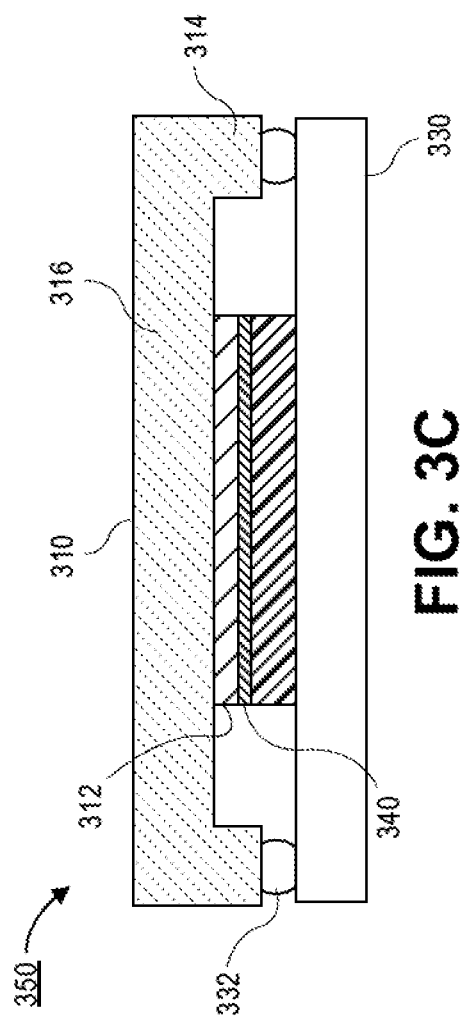
FIG. 3A
FIG. 3B
FIG. 3C

LIQUID METAL TIM WITH STIM-LIKE PERFORMANCE WITH NO BSM AND BGA COMPATIBLE

TECHNICAL FIELD

Embodiments of the present disclosure relate to electronics packaging, and more particularly, to liquid metal thermal interface materials (TIMs) that are high volume manufacturing compatible.

BACKGROUND

Indium-based solder thermal interface material (STIM) is currently the most widely-used package-level metallic thermal interface material (TIM). Indium is solid at room temperature, and thus requires reflowing at its 157° C. melting temperature to be applied in a package. Indium-based STIMs also rely on solder flux and gold metallization to achieve the intermetallic bonds necessary for surface adhesion. Additionally, since indium-based STIMs exist in the solid state during the usage of the package, the die and STIM must be made intentionally thick to decrease thermo-mechanical stress on the die.

In order to provide enhanced thermal performance, some third-party companies and end users have begun to replace STIMs with liquid metal TIMs. However, the process of applying liquid metal TIMs to the die and heat spreader is largely manual, and is not compatible with high volume manufacturing processes. The particular challenge that prevents the use of liquid metal TIMs in high volume manufacturing is that the liquid metal TIMs do not readily wet the surfaces of the heat spreader and the die.

In order to get the liquid metal TIM to wet the surfaces, the liquid metal TIM is manually scrubbed onto the surfaces. It is believed that the manual scrubbing process breaks an oxide shell that forms around the liquid metal TIM and, therefore, allows for the liquid metal TIM to wet to the surfaces. However, the manual scrubbing process requires each component to be manually processed.

BRIEF DESCRIPTION OF THE DRAWINGS

FIG. 3A is a cross-sectional illustration of the underside of an IHS with a thermal interface pad for use with a liquid metal TIM, in accordance with an embodiment.

FIG. 3B is a cross-sectional illustration of a die attached to a packaging substrate, in accordance with an embodiment.

FIG. 3C is a cross-sectional illustration of an electronic system with an IHS thermally coupled to a die with a liquid metal TIM, in accordance with an embodiment.

EMBODIMENTS OF THE PRESENT DISCLOSURE

Figure 1A:
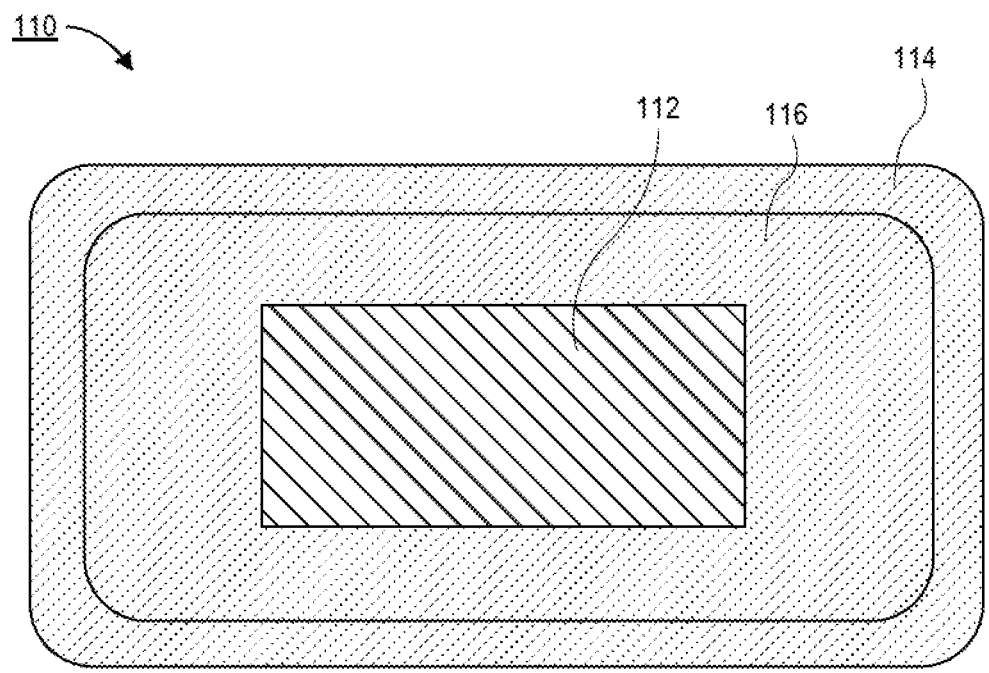
FIG. 1A is a plan view illustration of the underside of an integrated heat spreader (IHS) with a thermal interface pad for use with a liquid metal thermal interface material (TIM), in accordance with an embodiment.

Described in embodiments herein are electronic systems with a die thermally coupled to an integrated heat spreader (IHS) with a liquid metal TIM and methods of forming such electronic systems with high volume manufacturing (HVM) compatible processes. In the following description, various aspects of the illustrative implementations will be described using terms commonly employed by those skilled in the art to convey the substance of their work to others skilled in the art. However, it will be apparent to those skilled in the art that embodiments of the present invention may be practiced with only some of the described aspects. For purposes of explanation, specific numbers, materials and configurations are set forth in order to provide a thorough understanding of the illustrative implementations. However, it will be apparent to one skilled in the art that embodiments of the present invention may be practiced without the specific details. In other instances, well-known features are omitted or simplified in order not to obscure the illustrative implementations.

Various operations will be described as multiple discrete operations, in turn, in a manner that is most helpful in understanding embodiments of the present invention, however, the order of description should not be construed to imply that these operations are necessarily order dependent. In particular, these operations need not be performed in the order of presentation.

As noted above, liquid metal thermal interface materials (TIMs) have the ability to improve the thermal performance of devices. For example, liquid metal TIMs have a thin bond-line-thickness (BLT) and high thermal conductivity. Furthermore, liquid metal TIMs do not require gold or multi-operation, multi-layer metallization (e.g., backside metallization (BSM)). Embodiments disclosed herein also do not utilize flux materials to remove oxides. Since the liquid metal TIM is in the liquid phase during assembly conditions, there is no need to reflow at high temperatures. Additionally, since the liquid metal TIM remains liquid during the lifetime of the product, the die is mechanically decoupled from the integrated heat spreader (IHS). Such configurations puts low thermo-mechanical stress on the die, and therefore, does not require a thick die or a thick TIM, as is typically needed for STIM based configurations.

Accordingly, embodiments include a liquid metal TIM that is applied with processes that are compatible with high volume manufacturing in order to obtain the benefits of liquid metal TIMs without needing to manually process each unit with a scrubbing process. Embodiments include forming a thermal interface pad between the IHS and the die. The thermal interface pad is a material that is preferentially wetted by the liquid metal TIM. For example, the thermal interface pad may comprise one or more elemental constituents of the liquid metal TIM. The thermal interface pad may be applied to on one or both of the IHS and the die with a high volume manufacturing compatible process, such as cold-rolling. In an embodiment, the liquid metal wets the thermal interface pad (or pads) and the liquid metal is retained in the predefined interface while in the liquid phase.

In some embodiments, only one of the die and the IHS need to include a thermal interface pad that promotes wetting of the liquid metal TIM. However it is to be appreciated that some embodiments do include a thermal interface pad on both the IHS and the die. In embodiments where the die does not require a thermal interface pad, there is no need for metallizing the die either at the wafer-level or after being singulated and/or packaged.

In yet another embodiment, a liquid metal TIM may be manufactured from a solid thermal interface pad and a solid interface preform. In such an embodiment, a solid interface preform may be placed on the die and the solid thermal interface pad may be placed on the IHS. In an embodiment, the solid interface preform may have a melting temperature that is lower than a melting temperature of the solid thermal interface pad. Embodiments may include melting the solid interface preform after the IHS is attached to the package substrate. The melted preform may then interact with the solid thermal interface pad to form an alloy with a melting temperature that is below room temperature in order to provide a liquid metal TIM. In yet another embodiment, both the solid preform and the solid interface pad may be melted to form a liquid metal TIM.

Figure 1B:
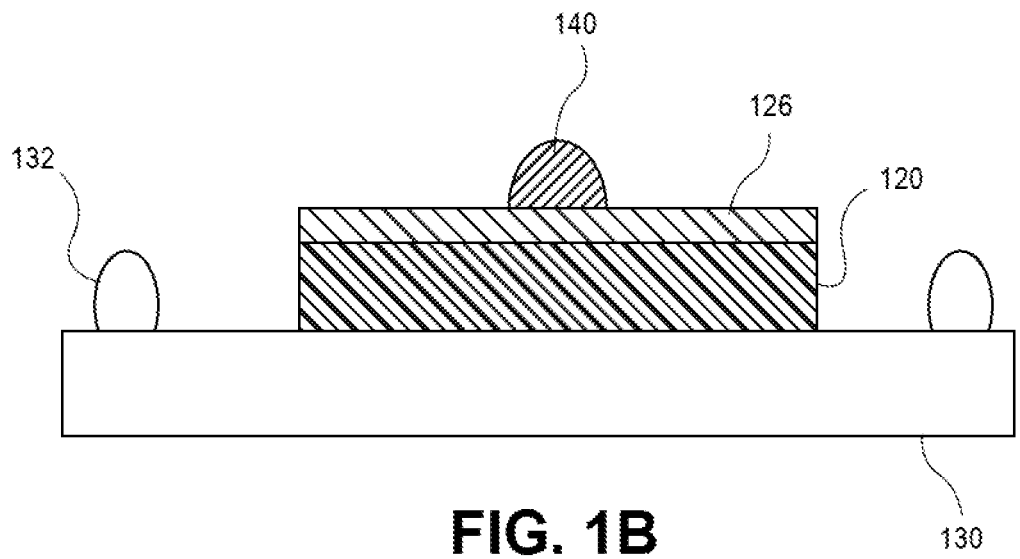
FIG. 1B is a cross-sectional illustration of a die with a thermal interface pad for use with a liquid metal TIM that is attached to a packaging substrate, in accordance with an embodiment.
Figure 1C:
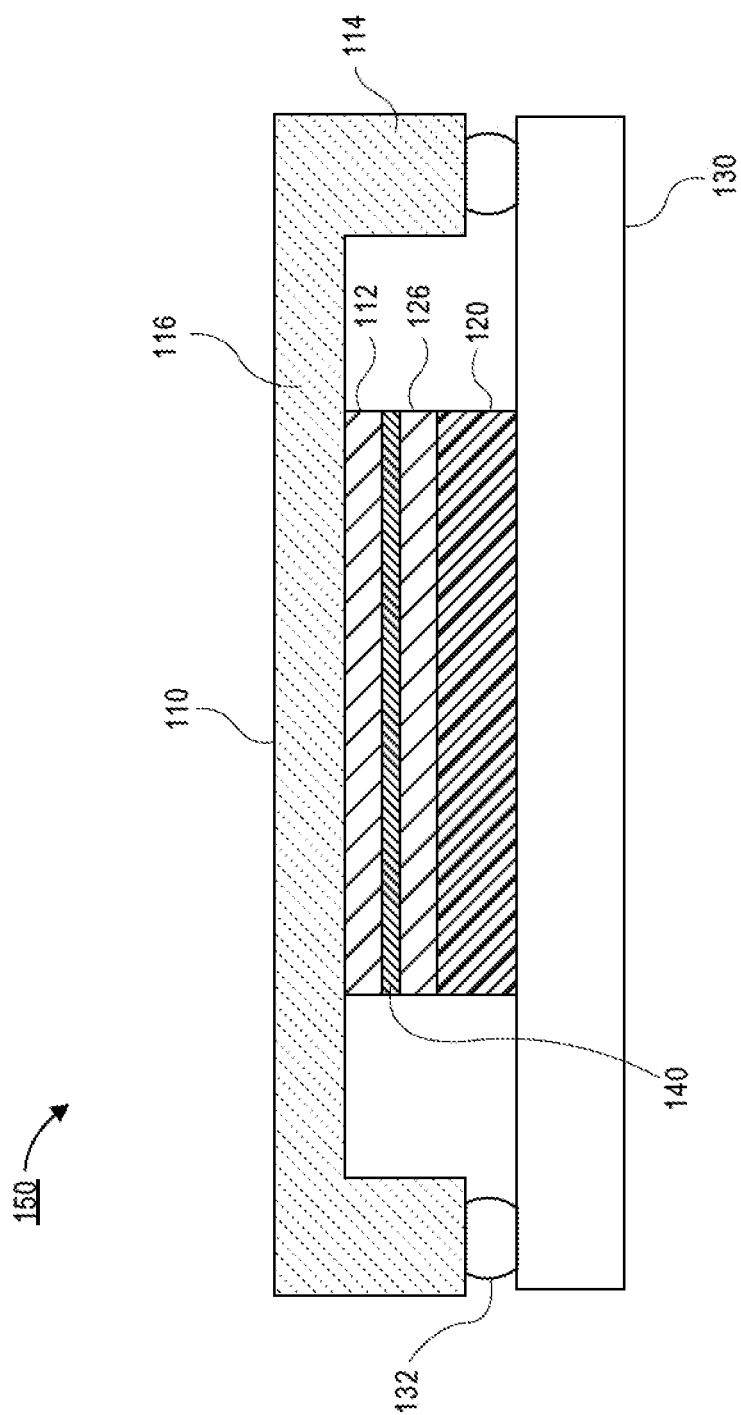
FIG. 1C is a cross-sectional illustration of an electronic system with an IHS thermally coupled to a die with a liquid metal TIM, in accordance with an embodiment.

Referring now to FIGS. 1A-1C, a process for thermally coupling an IHS to a die with a liquid metal TIM is shown, in accordance with an embodiment. In FIGS. 1A-1C, the process comprises forming a thermal interface pad 112 on the surface of the IHS 110 and forming a thermal interface pad 126 on the surface of the die 120. In an embodiment, the liquid metal TIM 140 may be disposed on the surface of thermal interface pad 126 on the die 120 prior to attaching the IHS 110 to the die 120. In an embodiment, the liquid metal TIM 140 is allowed to wet the surface of the thermal interface pad 126 prior to attaching the IHS 110 to the die 120.

Referring now to FIG. 1A, a plan view illustration of the underside of an IHS 110 with a thermal interface pad 112 is shown, in accordance with an embodiment. In an embodiment, the IHS 110 may be any suitable size or shape. In an embodiment, the IHS 110 may comprise a main body 116 with a rim 114 that extends out from a surface of the main body 116. In an embodiment, the rim 114 may be formed around a perimeter of the thermal interface pad 112. The rim 114 may be used to mechanically couple the IHS 110 to a package substrate. In an embodiment, the IHS 110 may be a thermally conductive material, such as copper. In an embodiment, the IHS 110 may comprise a coating (not shown) such as, nickel, gold, or the like.

In an embodiment, the thermal interface pad 112 is a layer that is disposed over the main body 116 of the IHS 110. In an embodiment, thermal interface pad 112 may be a material that is chosen to enhance the wetting of a liquid metal TIM. For example, the liquid metal TIM may comprise an alloy of two or more elements, and the thermal interface pad 112 may comprise one or more of the elements of the liquid metal TIM. In a particular example, the liquid metal TIM may comprise gallium, indium, and tin, and the thermal interface pad 112 may comprise one or more of gallium, indium, and tin. While the thermal interface pad 112 comprises one or more of the elemental constituents of the liquid metal TIM, it is to be appreciated that the thermal interface pad 112 remains in the solid phase during normal operating temperatures. For example, the thermal interface pad 112 may remain in the solid phase up to approximately 150° C.

In an embodiment, the thermal interface pad 112 may have a minimal thickness in order to minimize Z-height. In an embodiment, the thickness may be approximately 100 μm or less or approximately 50 μm or less. In an embodiment, the thermal interface pad 112 may be comprise a material that is malleable. For example, the thermal interface pad 112 may be a material that may be cold-worked (e.g., cold-rolled) to thicknesses below approximately 100 μm or to thicknesses below approximately 50 μm. In an embodiment, the thermal interface pad 112 may be cold-pressed onto the main body 116.

Referring now to FIG. 1B, a cross-sectional illustration of a die 120 that is packaged onto a packaging substrate 130 is shown, in accordance with an embodiment. In an embodiment, the die 120 may comprise any die. For example, the die 120 may be a processor or the like. In an embodiment, the die 120 may be package to the packaging substrate 130 with any suitable interconnect (not shown). For example, the die 120 may be mounted to the packaging substrate with a flip-chip interconnect or a copper-column interconnect.

In an embodiment, a thermal interface pad 126 may be formed over a backside surface of the die 120. The thermal interface pad 126 may be substantially similar to the thermal interface pad 112 formed on the IHS 110. In an embodiment, thermal interface pad 126 may be a material that is chosen to enhance the wetting of a liquid metal TIM. For example, the liquid metal TIM may comprise an alloy of two or more elements, and the thermal interface pad 126 may comprise one or more of the elements of the liquid metal TIM. In a particular example, the liquid metal TIM may comprise gallium, indium, and tin, and the thermal interface pad 126 may comprise one or more of gallium, indium, and tin.

While the thermal interface pad 126 comprises one or more of the elemental constituents of the liquid metal TIM, it is to be appreciated that the thermal interface pad 126 remains in the solid phase during normal operating temperatures. For example, the thermal interface pad 126 may remain in the solid phase up to approximately 150° C.

In an embodiment, the thermal interface pad 126 may have a minimal thickness in order to minimize Z-height. In an embodiment, the thickness may be approximately 100 μm or less or approximately 50 μm or less. In an embodiment, the thermal interface pad 126 may be comprise a material that is malleable. For example, the thermal interface pad 126 may be a material that may be cold-worked (e.g., cold-rolled) to thicknesses below approximately 100 μm or to thicknesses below approximately 50 μm. In an embodiment, the thermal interface pad 126 may be cold-pressed onto the backside of the die 120. In FIG. 1B, a volume of liquid metal TIM 140 has been deposited over the thermal interface pad 126. It is to be appreciated that the volume of the liquid metal TIM 140 will proceed to wet the thermal interface pad 126 after it is deposited.

In an embodiment, the liquid metal TIM 140 may have a melting temperature that allows for the liquid metal TIM 140 to remain in the liquid phase during typical operating conditions for the die 120. For example, the liquid metal TIM 140 may have a melting temperature that is 0° C. or below. In an embodiment, the liquid metal TIM 140 may comprise gallium, indium, and tin. In a particular embodiment, the liquid metal TIM 140 may comprise 68.5% gallium, 21.5% indium, and 10% tin. In such an embodiment, the melting temperature of the liquid metal TIM 140 may be −19° C. While an alloy of gallium, indium, and tin is disclosed as being used for the liquid metal TIM 140, it is to be appreciated that any alloy that is in the liquid phase during normal operating conditions may be used in accordance with embodiments described herein.

In an embodiment, a sealant 132 may be formed around a perimeter of the die 120. In an embodiment, the sealant 132 may mechanically couple the IHS 110 to the package substrate 130. For example, the sealant 132 may be an epoxy or the like. In an embodiment, the rim 114 of the IHS 110 may interface with the sealant 132, as illustrated in FIG. 1C. In an embodiment, the IHS 110 may be coupled to the die 120 with a direct lid-attach (DLA) process, or the like.

Referring now to FIG. 1C, a cross-sectional illustration of an electronic system 150 with an IHS 110 of FIG. 1A coupled to the package substrate 130 of FIG. 1B by sealant 132 is shown, in accordance with an embodiment. In an embodiment, the IHS 110 may be thermally coupled to the die 120 by a liquid metal TIM 140. The liquid metal TIM 140 may wet the surface of a thermal interface pad 112 on the IHS 110 and the thermal interface pad 126 on the die 120. Since the liquid metal TIM 140 preferentially wets the thermal interface pads 112 and 126, the liquid metal TIM 140 is maintained at the interface between the die 120 and the IHS 110 even though the liquid metal TIM 140 remains in a liquid state during normal operating conditions.

Figure 2A:
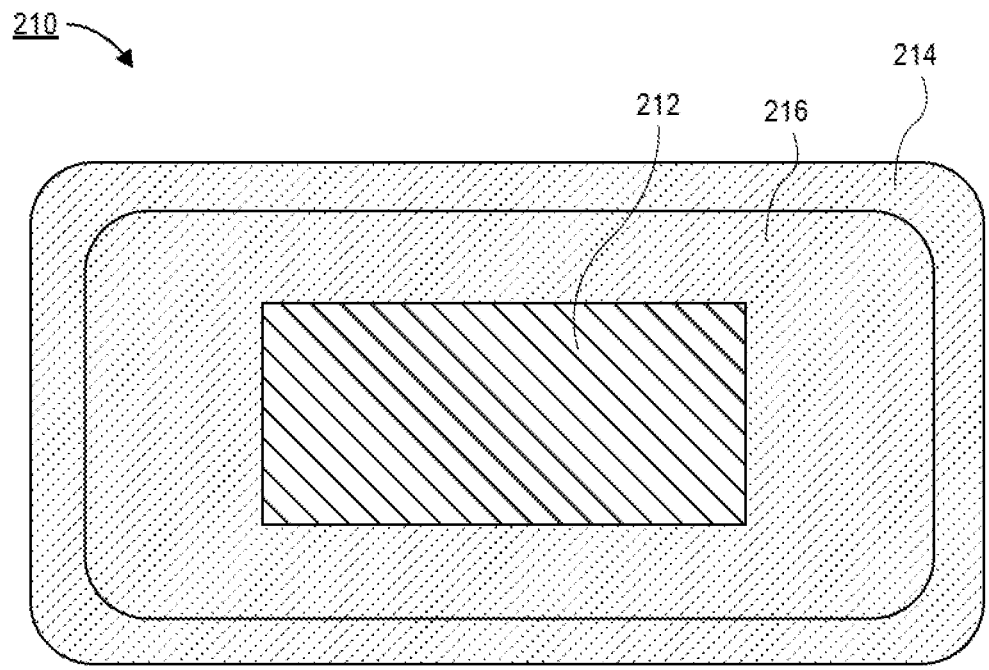
FIG. 2A is a plan view illustration of the underside of an IHS with a thermal interface pad for use with a liquid metal TIM, in accordance with an embodiment.
Figure 2B:
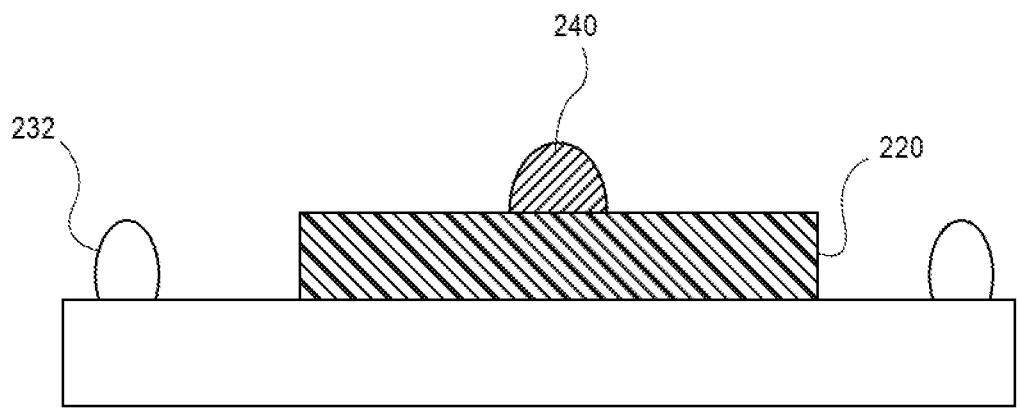
FIG. 2B is a cross-sectional illustration of a die attached to a packaging substrate, in accordance with an embodiment.
Figure 2C:
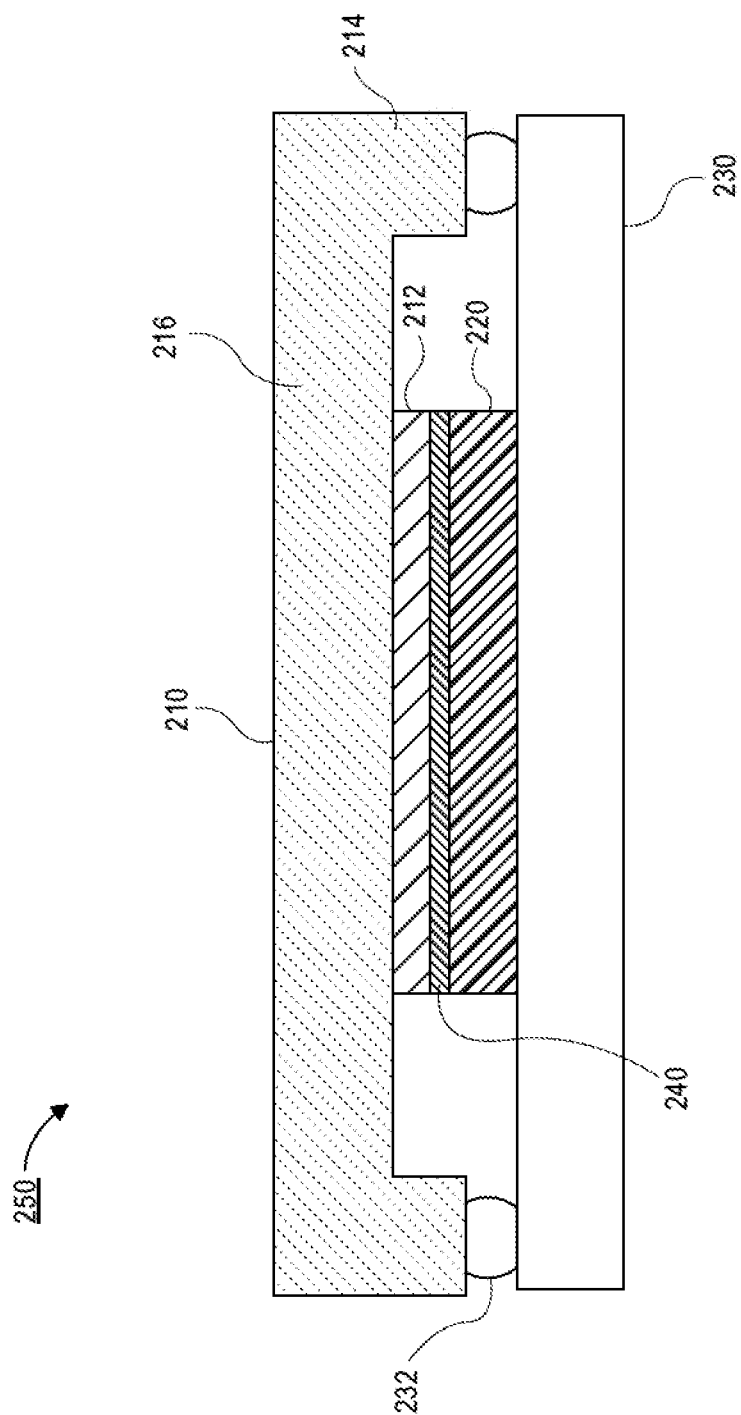
FIG. 2C is a cross-sectional illustration of an electronic system with an IHS thermally coupled to a die with a liquid metal TIM, in accordance with an embodiment.

Referring now to FIGS. 2A-2C, a series of illustrations showing a process for thermally coupling an IHS 210 to a die 220 is shown in accordance with an additional embodiment. In FIG. 2A a plan view illustration of the underside of an IHS 210 that comprises a thermal interface pad 212 disposed on the main body 216 of the IHS 210 is shown, in accordance with an embodiment. In an embodiment, the IHS 210 may be substantially similar to the IHS described above with respect to FIG. 1A.

Referring now to FIG. 2B, a cross-sectional illustration of a die 220 coupled to a package substrate 230 by sealant 232 is shown, in accordance with an embodiment. In an embodiment, the die 220 is substantially similar to the die 120 described above with respect to FIG. 1B, with the exception that the die 220 does not comprise a thermal interface pad over the backside surface. In such an embodiment, a liquid metal TIM 240 may be disposed on the bare backside surface of the die 220. Since there is no thermal interface pad on the die 220, the liquid metal TIM 240 may not wet the surface of the die 220.

Referring now to FIG. 2C, a cross-sectional illustration of a system 250 that comprises the IHS 210 of FIG. 2A thermally coupled to the die 220 of FIG. 2B is shown, in accordance with an embodiment. In an embodiment, a single thermal interface pad 212 is formed between the IHS 210 and the die 220 (i.e., the thermal interface pad 212 formed on the IHS 210). As the IHS 210 is mechanically coupled to the package substrate 230 with the sealant 232, the liquid metal TIM 240 that was disposed on the bare die 220 comes into contact with the thermal interface pad 212 of the IHS 210 and wets the thermal interface pad 212 to form a liquid metal TIM 240 interface between the IHS 210 and the die 220. It is to be appreciated that even though the liquid metal TIM 240 only contacts a single thermal interface pad 212, the liquid metal TIM 240 still is isolated to the interface between the IHS 210 and the die 220 since the liquid metal TIM 240 preferentially wets the thermal interface pad 212.

Such an embodiment may be particularly amenable to high volume manufacturing processes since no additional layers need to be formed on the die 210. As such, existing packaging process may be used, with the exception of adding an operation for depositing a volume of liquid metal TIM 240 onto the bare die backside surface. Furthermore, depositing the liquid metal TIM 240 onto the die 220 allows for the IHS 210 to be handled without the presence of a liquid metal TIM 240 on the surface of the IHS 210. However, it is to be appreciated that embodiments are not limited to placing the liquid metal TIM 240 on the die 220. For example, the liquid metal TIM 240 may be disposed on the IHS 210 prior to coupling the IHS 210 to the die 220. In an embodiment, the IHS 210 may be coupled to the die 220 with a DLA process, or the like.

Referring now to FIGS. 3A-3C, a series of cross-sectional illustrations of a process flow where the liquid metal TIM 340 is placed on the thermal interface pad 312 of the IHS 310 prior to coupling the IHS 310 to the die 320 is shown, in accordance with an embodiment.

Referring now to FIG. 3A, a cross-sectional illustration of an IHS 310 is shown with a liquid metal TIM 340 disposed on a surface of the thermal interface pad 312 is shown, in accordance with an embodiment. In an embodiment, the IHS 310 may be substantially similar to the IHS 110 described with respect to FIG. 1A. In FIG. 3A the liquid metal TIM 340 is shown prior to wetting the surface of the thermal interface pad 312. However, it is to be appreciated that the liquid metal TIM 340 may wet the surface of the thermal interface pad 312 prior to the IHS 310 being coupled to the die 320.

As indicated by the arrow between FIGS. 3A and 3B, the IHS 310 with the liquid metal TIM 340 may be positioned over the die 320 and secured to the package substrate 330 with the sealant 332 to form system 350 illustrated in FIG. 3C. The die 320 and package substrate 330 illustrated in FIG. 3B may be substantially similar to the die 220 and package substrate 230 illustrated in FIG. 2B, with the exception that there is no liquid metal TIM on the die backside. In an embodiment, the IHS 310 may be coupled to the die 320 with a DLA process, or the like. The system 350 illustrated in FIG. 3C may be substantially similar to the system 250 described with respect to FIG. 2C.

In FIGS. 1A-1C, schematic illustrations of the IHS are shown without detail in order to not obscure the processing operations described in greater detail. However, it is to be appreciated that embodiments include an IHS with many different configurations. Examples of such embodiments are illustrated in FIGS. 4-6B.

Figure 4A:
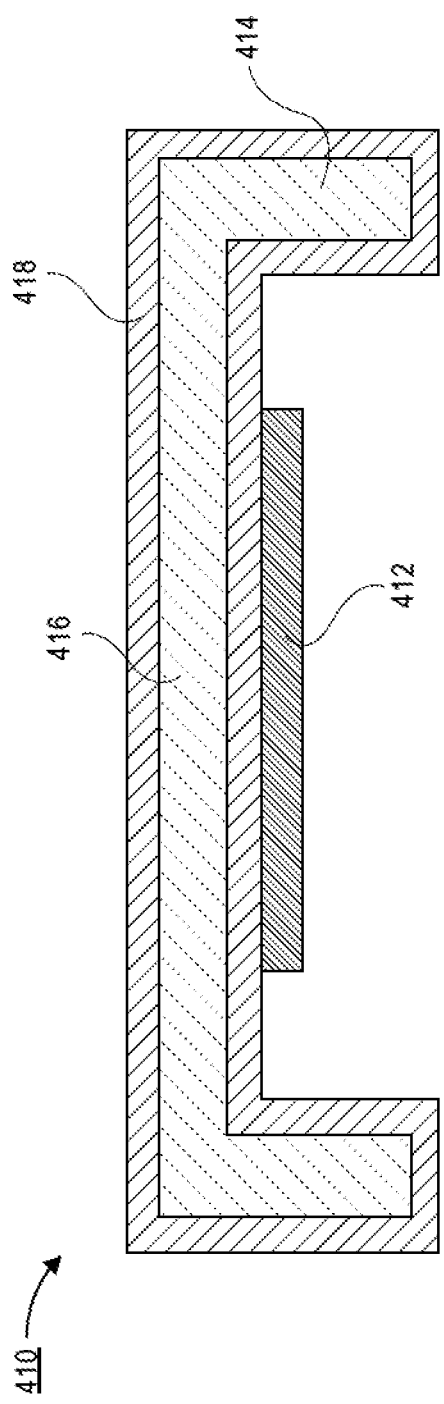
FIG. 4A is a cross-sectional illustration of an IHS with a coating and a thermal interface pad, in accordance with an embodiment.

Referring now to FIG. 4A, a cross-sectional illustration of an IHS 410 is shown, in accordance with an embodiment. In an embodiment, the IHS 410 may comprise a main body 416 and a rim 414 extending out from the main body 416. The main body 416 and the rim 414 may comprise a thermally conductive material, such as copper. In an embodiment, a coating 418 may be formed over surfaces of the main body 416 and the rim 414. The coating 418 may be a diffusion barrier, applied for cosmetic purposes, applied for thermal performance, and/or for any other desired purpose. For example, the coating 418 may comprise nickel, gold, silver, or any other material.

Figure 4B:
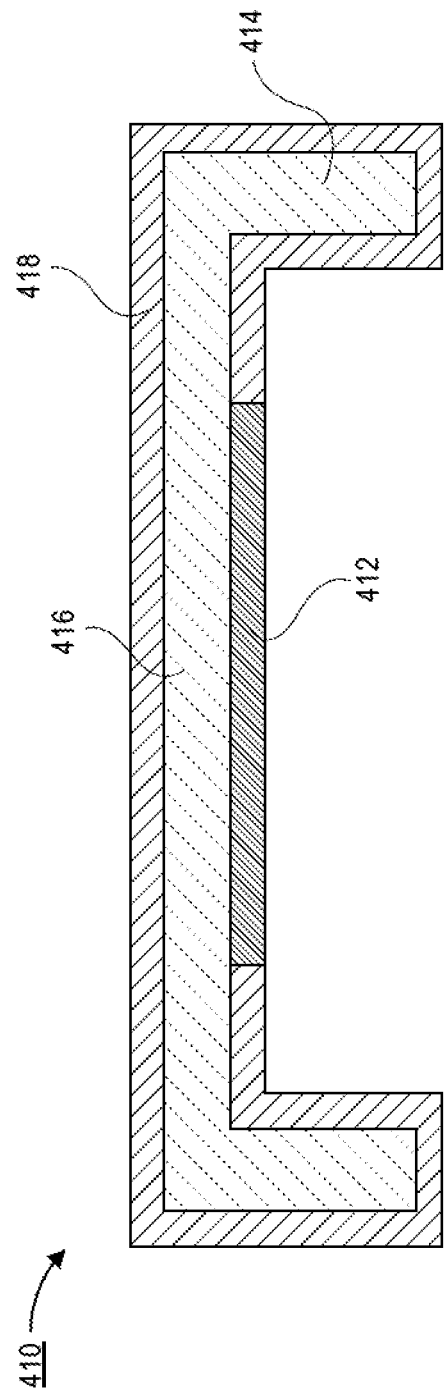
FIG. 4B is a cross-sectional illustration of an IHS with a thermal interface pad and a coating over portions of the IHS, in accordance with an embodiment.

It is to be appreciated that the coating 418 is a distinct component from the thermal interface pad 412. For example, the thermal interface pad 412 may be formed over the coating 418. In additional embodiments, the thermal interface pad 412 may be formed in direct contact with the main body 416 and the coating 418 may be formed around (but not over the entire surface of) the thermal interface pad 412, as illustrated in FIG. 4B.

Figure 5:
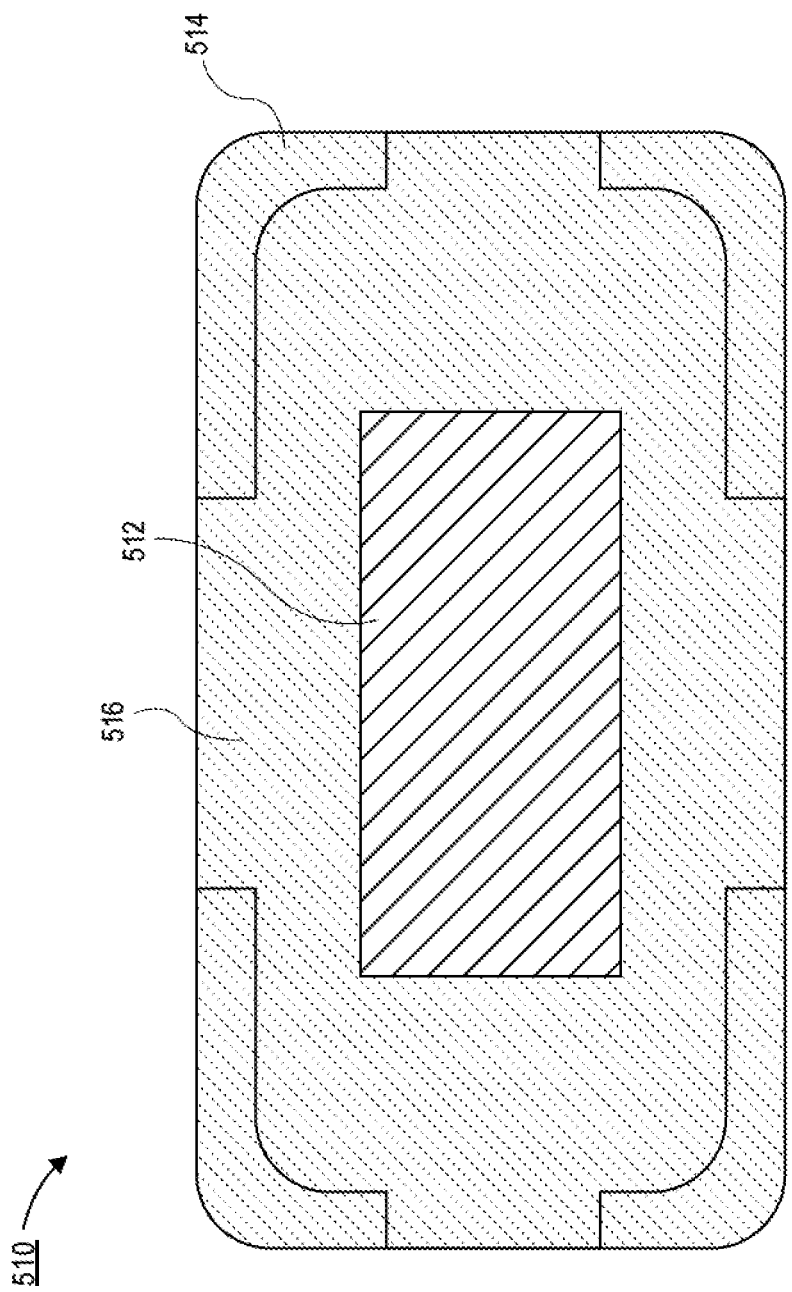
FIG. 5 is a plan view illustration of an IHS with a rim that is non-continuous around the thermal interface pad, in accordance with an embodiment.

Referring now to FIG. 5, a plan view illustration of the underside of an IHS 510 is shown in accordance with an additional embodiment. Particularly, the embodiment illustrated in FIG. 5 illustrates that the rim 514 that extends out from the main body 516 does not need to form a continuous perimeter around the thermal interface pad 512. For example, the rim 514 may be discontinuous. It is to be appreciated that embodiments are not limited to any rim configuration.

Figure 6A:
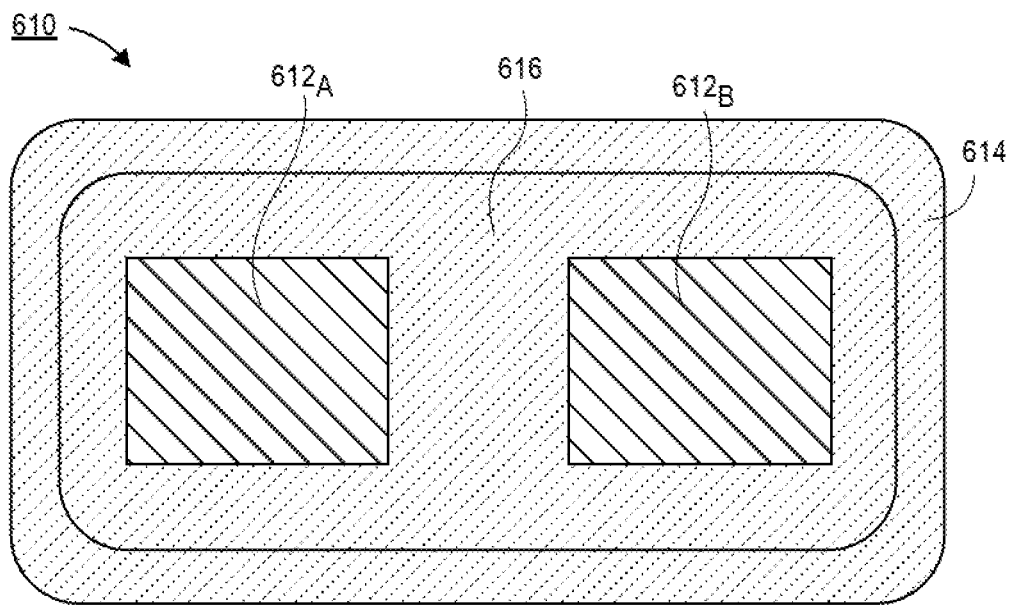
FIG. 6A is a plan view illustration of an IHS with a plurality of thermal interface pads, in accordance with an embodiment.
Figure 6B:
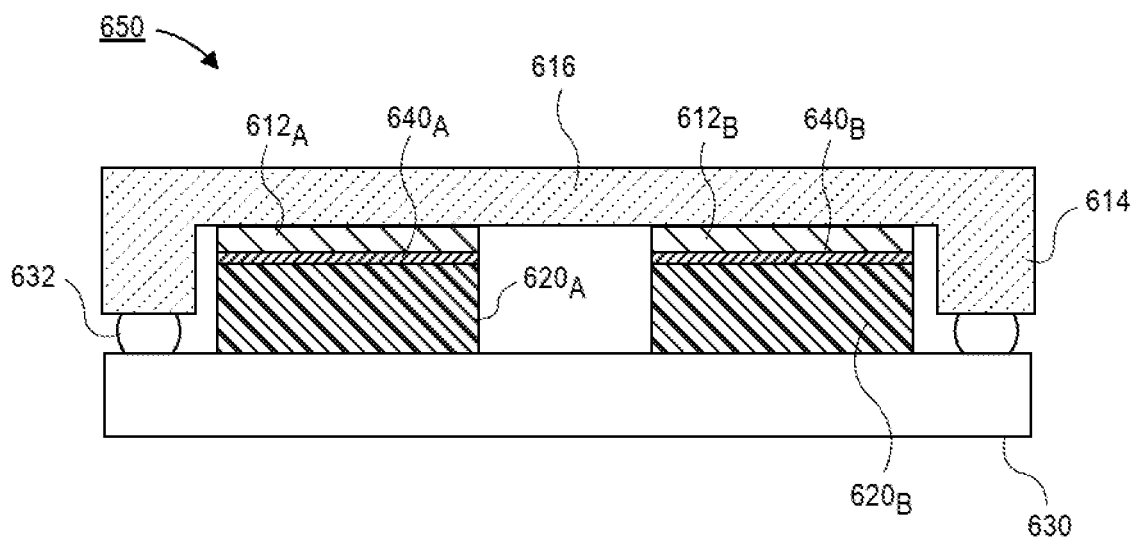
FIG. 6B is a cross-sectional illustration of an electronic system with an IHS thermally coupled to a plurality of dies with liquid metal TIM, in accordance with an embodiment.

Referring now to FIGS. 6A and 6B, a plan view of an IHS 610 (FIG. 6A) and a cross-sectional illustration of a system 650 that include IHS 610 (FIG. 6B) are shown, in accordance with an embodiment. As shown in FIG. 6A, a plurality of thermal interface pads 612 may be formed on the main body 616 of an IHS 610. For example, IHS 610 includes a first thermal interface pad 612A and a second thermal interface pad 612E within the perimeter of the rim 614. While two thermal interface pads 612 are shown, it is to be appreciated that embodiments are not limited to any particular number of thermal interface pads. The inclusion of a plurality of thermal interface pads 612 allows for the liquid metal TIM to be isolated to discrete regions of the IHS 610.

For example, as illustrated in FIG. 6B, the IHS 610 may be coupled to a package substrate 630 by a sealant 632, and a first thermal interface pad 612A may be thermally coupled to a first die 620A by a first liquid metal TIM 640A and a second thermal interface pad 612E may be thermally coupled to a second die 620B by a second liquid metal TIM 640B. While FIG. 6B illustrates each thermal interface pad 612 being thermally coupled to a different die 620, it is to be appreciated that more than one thermal interface pad 612 may be coupled to the same die. For example, two or more thermal interface pads 612 may be thermally coupled to a single die 620.

In accordance with additional embodiments, a liquid metal TIM may also be fabricated with solid materials that are subsequently alloyed to form liquid metal TIMs. Such embodiments may be particularly beneficial since no liquid material needs to be dispensed. Accordingly, the complexity of high volume manufacturing is reduced even further. Examples of such embodiments are explained in detail with respect to FIGS. 7A-8D.

Figure 7A:
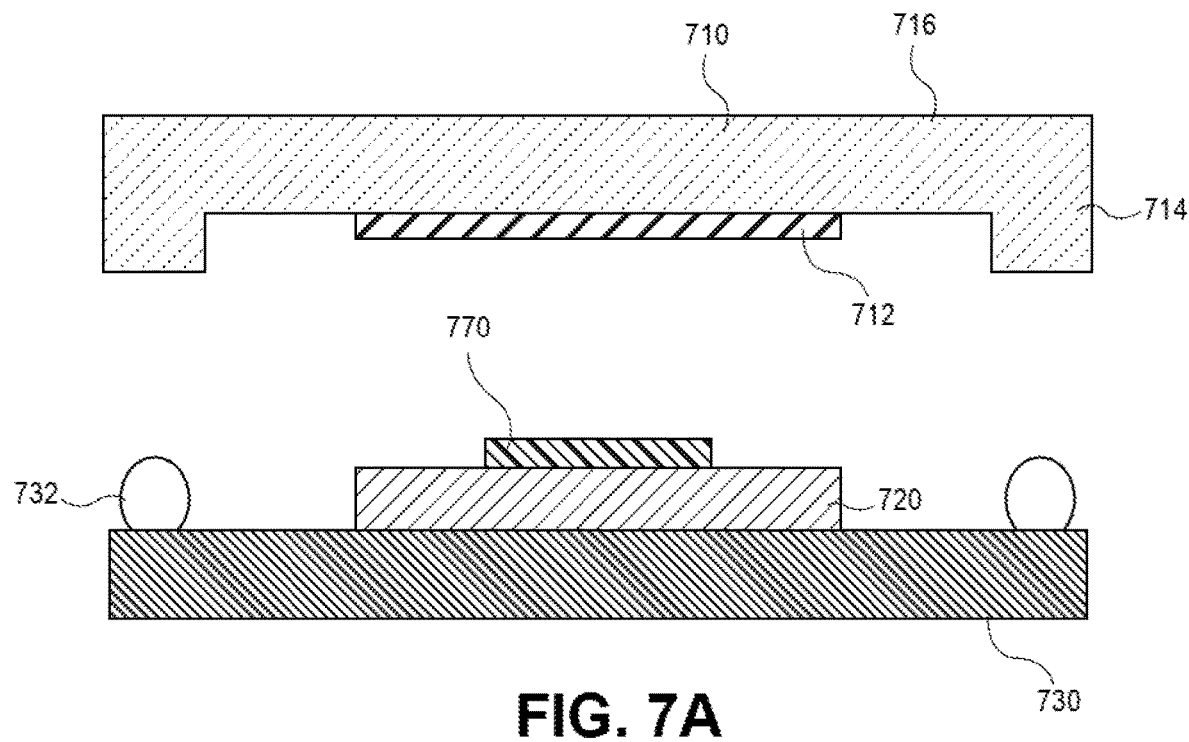
FIG. 7A is a cross-sectional illustration of an IHS with a thermal interface pad aligned over a packaged die with a solid interface preform over the die, in accordance with an embodiment.

Referring now to FIG. 7A, a cross-sectional illustration of an IHS 710 aligned over a packaged die 720 is shown, in accordance with an embodiment. In an embodiment, IHS 710 comprises a thermal interface pad 712 disposed on the main body 716 of the IHS 710. The IHS 710 may include a rim 714.

In an embodiment, the thermal interface pad 712 is a layer that is placed over the main body 716 of the IHS 710 with any suitable process. In a particular embodiment, the thermal interface pad 712 may be cold-pressed onto the main body 716. In an embodiment, thermal interface pad 712 may be a material that may be alloyed with a solid interface preform 770 formed over the die 720 to form a liquid metal TIM (as will be described in greater detail below). In an embodiment, the thermal interface pad 712 may be a material that has a melting temperature that is greater than a melting temperature of the solid interface preform 770. For example, when the solid interface preform 770 comprises gallium, the thermal interface pad 712 may comprise indium.

In an embodiment, the thermal interface pad 712 may have a minimal thickness in order to minimize Z-height. In an embodiment, the thickness may be approximately 100 µm or less or approximately 50 µm or less.

In an embodiment, the die 720 may be packaged on a packaging substrate 730. Embodiments may include any type of die 720 that is coupled to the packaging substrate 730 with any suitable interconnect (not shown). In an embodiment, a sealant 732 may be formed on a surface of the packaging substrate 730 for securing the IHS 710 to the packaging substrate 730.

In an embodiment, a solid interface preform 770 may be placed on a surface of the die 720. The solid interface preform 770 may be placed on the surface of the die 720 with a pick and place process, or the like. The use of a solid interface preform 770 simplifies the processing since no liquid dispensing is necessary. In an embodiment, the solid interface preform 770 may be a material that, when alloyed with a portion of the thermal interface pad 712 on the IHS 710, has a melting temperature below the expected operating conditions of the die 720.

Figure 7B:
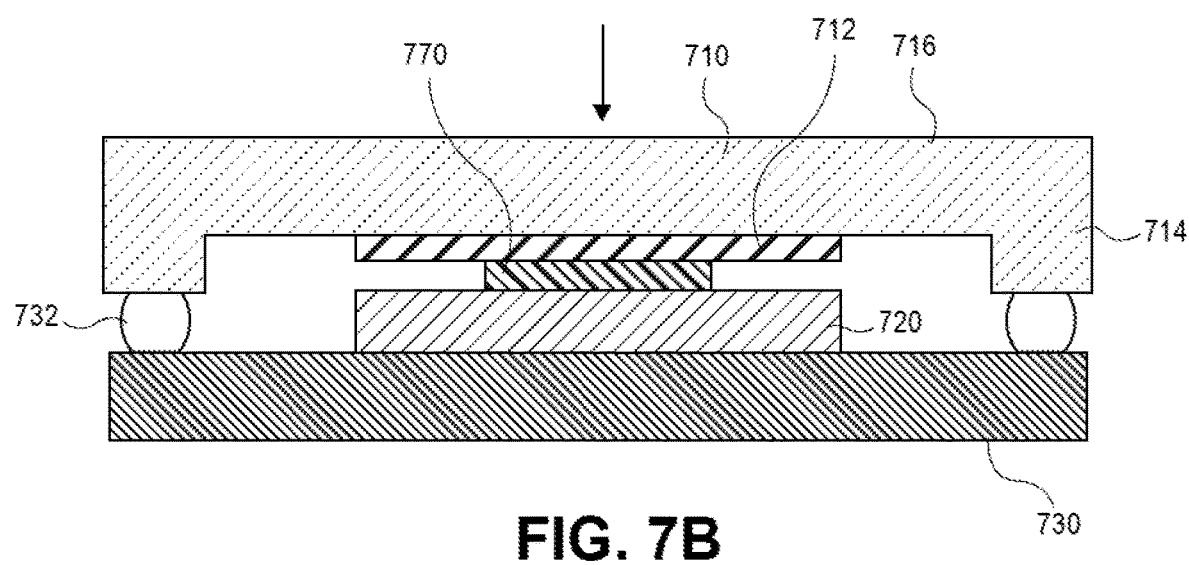
FIG. 7B is a cross-sectional illustration of the IHS in FIG. 7A being secured to the packaging substrate, in accordance with an embodiment.

Referring now to FIG. 7B, a cross-sectional illustration of the IHS 710 being brought into contact with the packaging substrate 730 (as indicated by the arrow) is shown, in accordance with an embodiment. In an embodiment, the solid thermal interface pad 712 may be brought into contact with solid interface preform 770.

Figure 7C:
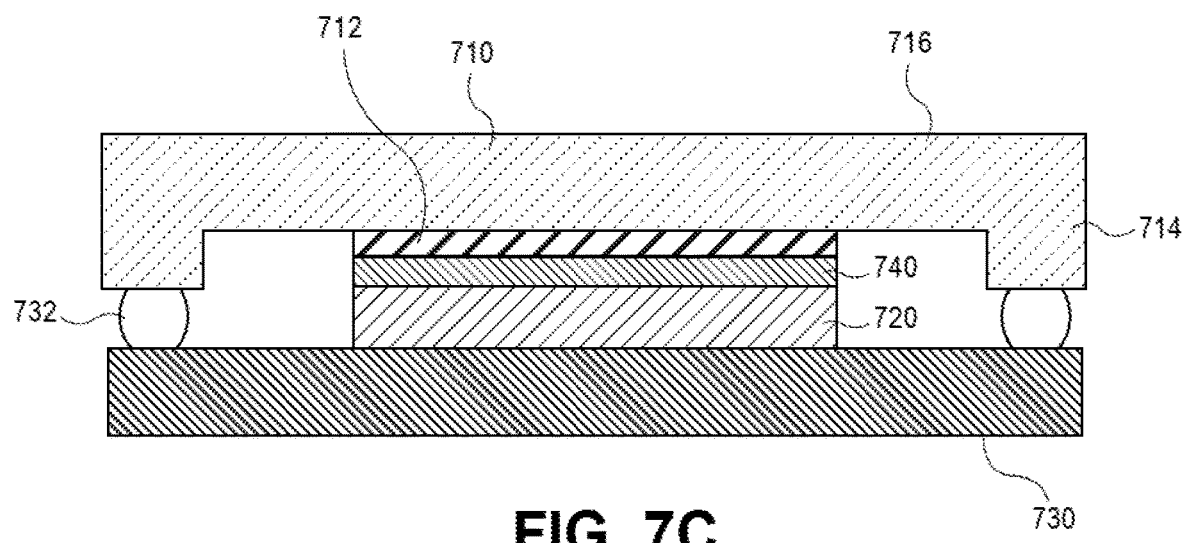
FIG. 7C is a cross-sectional illustration after the solid preform is melted and reacts with portions of the thermal interface pad to form a liquid metal TIM, in accordance with an embodiment.

Referring now to FIG. 7C, a cross-sectional illustration after the solid interface preform 770 is melted is shown, in accordance with an embodiment. In an embodiment, the system may be exposed to a temperature above the melting temperature of the solid interface preform 770, but below a melting temperature of the thermal interface pad 712. For example, when the solid interface preform 770 is gallium and the thermal interface pad 712 is indium, the system may be held at a temperature above 30° C. but below 158° C. Accordingly, only the solid interface preform 770 is melted.

In an embodiment, the melted interface preform 770 may react with the surface of the thermal interface pad 712. That is, portions of the thermal interface pad 712 may diffuse into the melted interface preform 770 to form an alloy with a melting temperature below the melting temperature of the solid metal preform 770. For example, in embodiments with gallium as the solid metal preform 770 and indium as the thermal interface pad 712, an alloy of gallium with less than 20 weight percent indium may form a liquid metal TIM 740. In an embodiment, the liquid metal TIM may have between 10 and 20 weight percent indium. Since the melting point of such a Ga—In alloy is approximately 15° C. and room temperature is well above the alloy's full liquid temperature, the Ga—In liquid metal will remain in pure liquid phase throughout the entire life in the use condition.

In an embodiment, portions of the thermal interface pad 712 may remain behind after the alloying. That is, in the finished device, portions of the thermal interface pad 712 may remain. The remaining portion of the thermal interface pad 712 may help with spreading and retaining the liquid metal TIM 740, similar to what is described above. Furthermore, while the thermal interface pad 712 is shown as being formed over the IHS 710 and the solid interface preform 770 is shown as being formed over the die 720, it is to be appreciated that the components may be reversed. That is, in some embodiments, the thermal interface pad 712 may be formed over the die 720 and the solid interface preform 770 may be formed over the IHS 710.

Referring now to FIGS. 8A-8D, a series of cross-sectional illustrations of an additional process for forming a liquid metal TIM without a liquid dispensing operation are shown, in accordance with an additional embodiment.

Figure 8A:
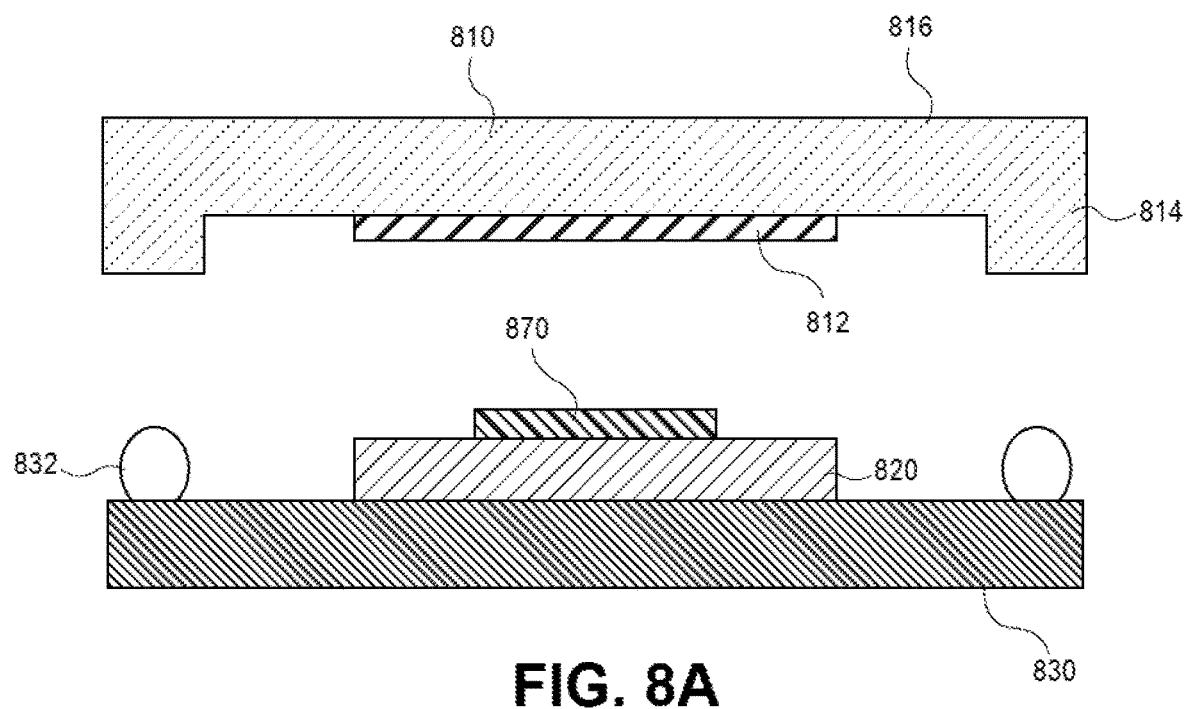
FIG. 8A is a cross-sectional illustration of an IHS with a thermal interface pad aligned over a packaged die with a solid interface preform over the die, in accordance with an additional embodiment.

Referring now to FIG. 8A, a cross-sectional illustration of an IHS 810 aligned over a packaged die 820 is shown, in accordance with an embodiment. In an embodiment, IHS 810 comprises a thermal interface pad 812 formed on the main body 816 of the IHS 810. The IHS 810 may include a rim 814.

In an embodiment, the thermal interface pad 812 is a layer that is formed over the main body 816 of the IHS 810 with any suitable process. In a particular embodiment, the thermal interface pad 812 may be cold-pressed onto the main body 816. In an embodiment, thermal interface pad 812 may be a material that may be alloyed with a solid interface preform 870 formed over the die 820 to form a liquid metal TIM (as will be described in greater detail below). In an embodiment, the thermal interface pad 812 may be a material that has a melting temperature that is greater than a melting temperature of the solid interface preform 870. For example, when the solid interface preform 870 comprises gallium, the thermal interface pad 812 may comprise indium.

In an embodiment, the die 820 may be packaged on a packaging substrate 830. Embodiments may include any type of die 820 that is coupled to the packaging substrate 830 with any suitable interconnect (not shown). In an embodiment, a sealant 832 may be formed on a surface of the packaging substrate 830 for securing the IHS 810 to the packaging substrate 830.

In an embodiment, a solid interface preform 870 may be placed on a surface of the die 820. The solid interface preform 870 may be placed on the surface of the die 820 with a pick and place process, or the like. The use of a solid interface preform 870 simplifies the processing since no liquid dispensing is necessary. In an embodiment, the solid interface preform 870 may be a material that, when alloyed with the thermal interface pad 812 on the IHS 810, has a melting temperature below the expected operating conditions of the die 820 during operation.

Figure 8B:
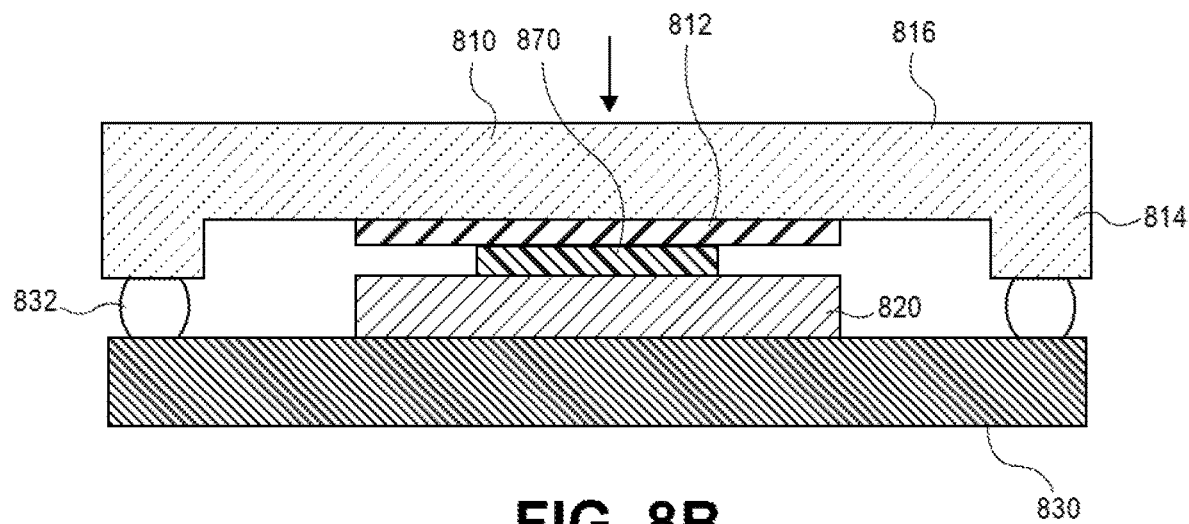
FIG. 8B is a cross-sectional illustration of the IHS in FIG. 8A being secured to the packaging substrate, in accordance with an embodiment.

Referring now to FIG. 8B, a cross-sectional illustration of the IHS 810 being brought into contact with the packaging substrate 830 (as indicated by the arrow) is shown, in accordance with an embodiment. In an embodiment, the solid thermal interface pad 812 may be brought into contact with solid interface preform 870.

Figure 8C:
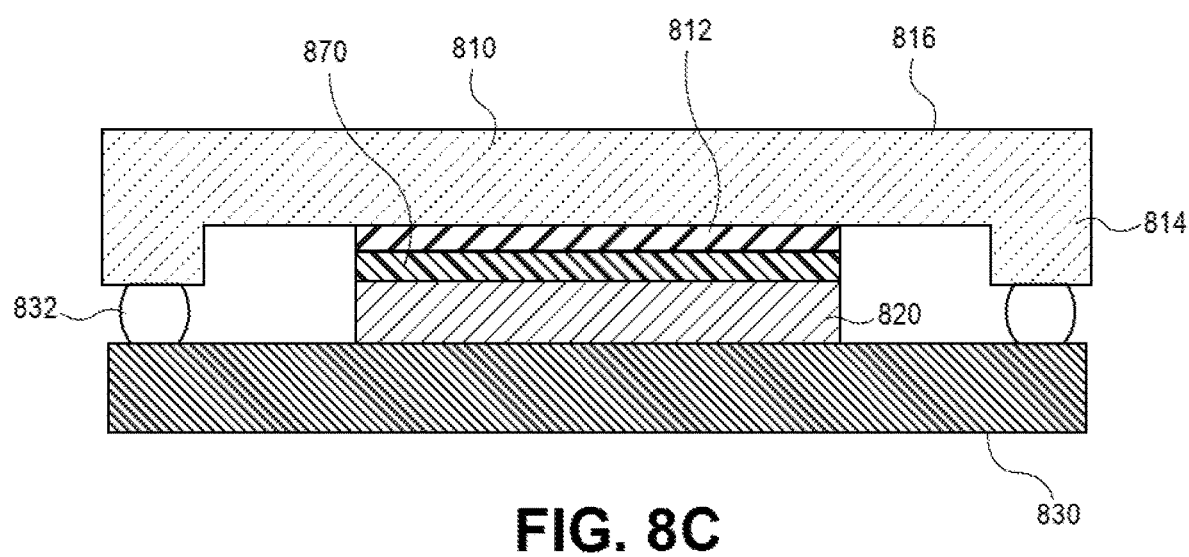
FIG. 8C is a cross-sectional illustration after the solid interface preform is melted, in accordance with an embodiment.

Referring now to FIG. 8C, a cross-sectional illustration after the solid interface preform 870 is melted is shown, in accordance with an embodiment. In an embodiment, the solid interface preform 870 may wet over the surface of the thermal interface pad 812. Accordingly, issues with poor wetting are mitigated.

Figure 8D:
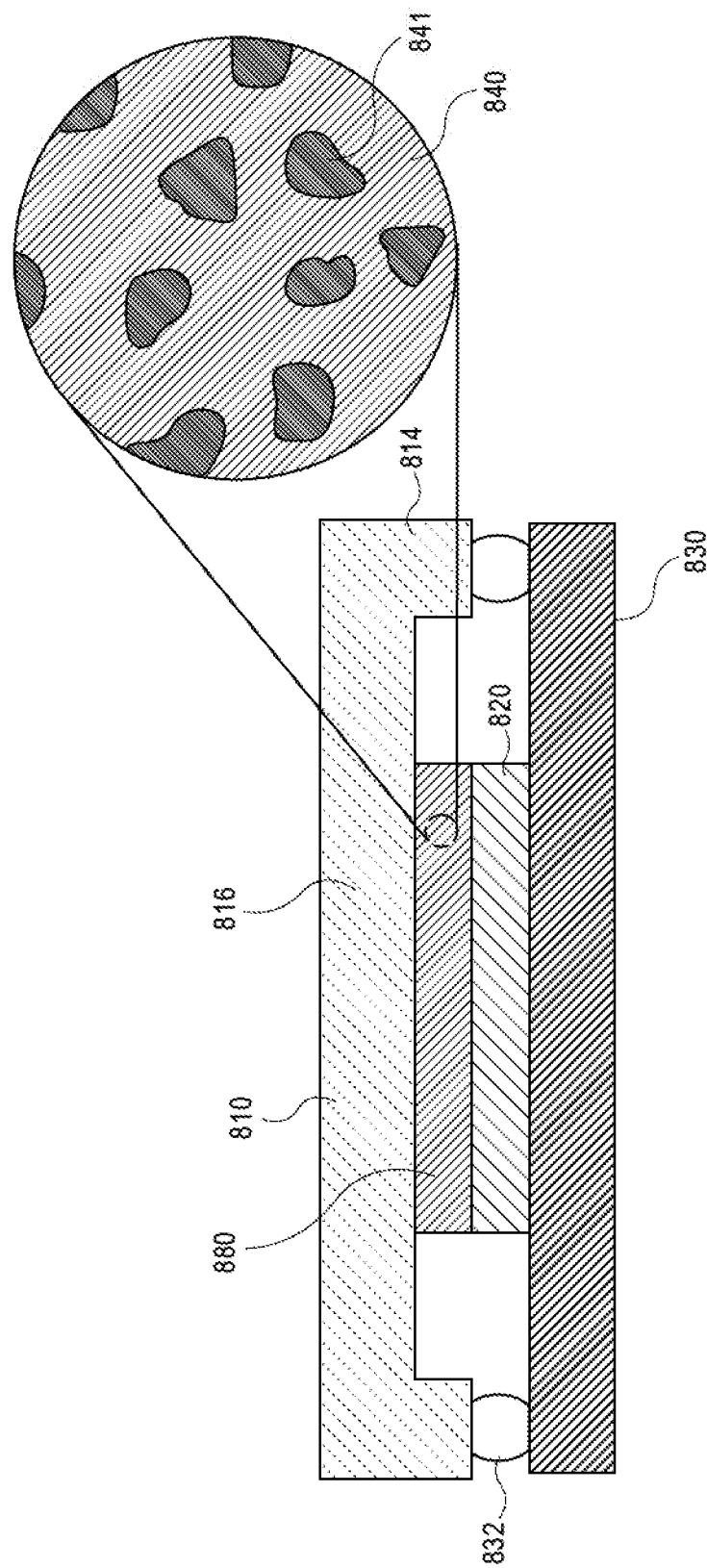
FIG. 8D is a cross-sectional illustration after the thermal interface pad is melted and alloyed with the melted interface preform to form a liquid metal TIM, in accordance with an additional embodiment.

Referring now to FIG. 8D, a cross-sectional illustration after the thermal interface pad 812 is melted is shown, in accordance with an embodiment. In an embodiment, the temperature may be increased to above the melting temperature of the thermal interface pad 812. For example, the system may be raised to a temperature that is greater than approximately 158° C. While FIGS. 8C and 8D illustrate two separate melting operations, it is to be appreciated that a single melting operation that includes providing a temperature above the melting temperatures of both materials may also be used.

The melted thermal interface pad 812 and the solid interface preform 870 may then alloy to form a liquid metal TIM 880. In an embodiment, the weight percentages of the constituents of the liquid metal TIM 880 may be chosen by controlling the volumes of the thermal interface pad 812 and the solid interface preform 870.

In a particular embodiment, the liquid metal TIM 880 may have a weight percentage that is 20 weight percent indium or greater and the remaining weight percent is gallium. In an additional embodiment, the liquid metal TIM 880 may have a weight percentage that is between 20 and 30 weight percent indium and the remaining weight percent is gallium. Furthermore, other embodiments may include liquid metal TIM 880 that is an alloy of more than two elements.

In some embodiments, the resulting liquid metal TIM 880 may be a two-phase material, as shown in the zoomed in microstructure. As shown, the resulting microstructure of the liquid metal TIM 880 may comprise a liquid component 840 and solid precipitates 841. For example, the liquid component 840 may have gallium as the majority constituent and the solid may have indium as the majority constituent. The presence of solid precipitates is beneficial because it prevents the risk of the liquid metal TIM 880 from being pumped out of the interface between the IHS 810 and the die 820.

Furthermore, while the thermal interface pad 812 is shown as being formed over the IHS 810 and the solid interface preform 870 is shown as being formed over the die 820, it is to be appreciated that the components may be reversed. That is, in some embodiments, the thermal interface pad 812 may be formed over the die 820 and the solid interface preform 870 may be formed over the IHS 810.

Figure 9:
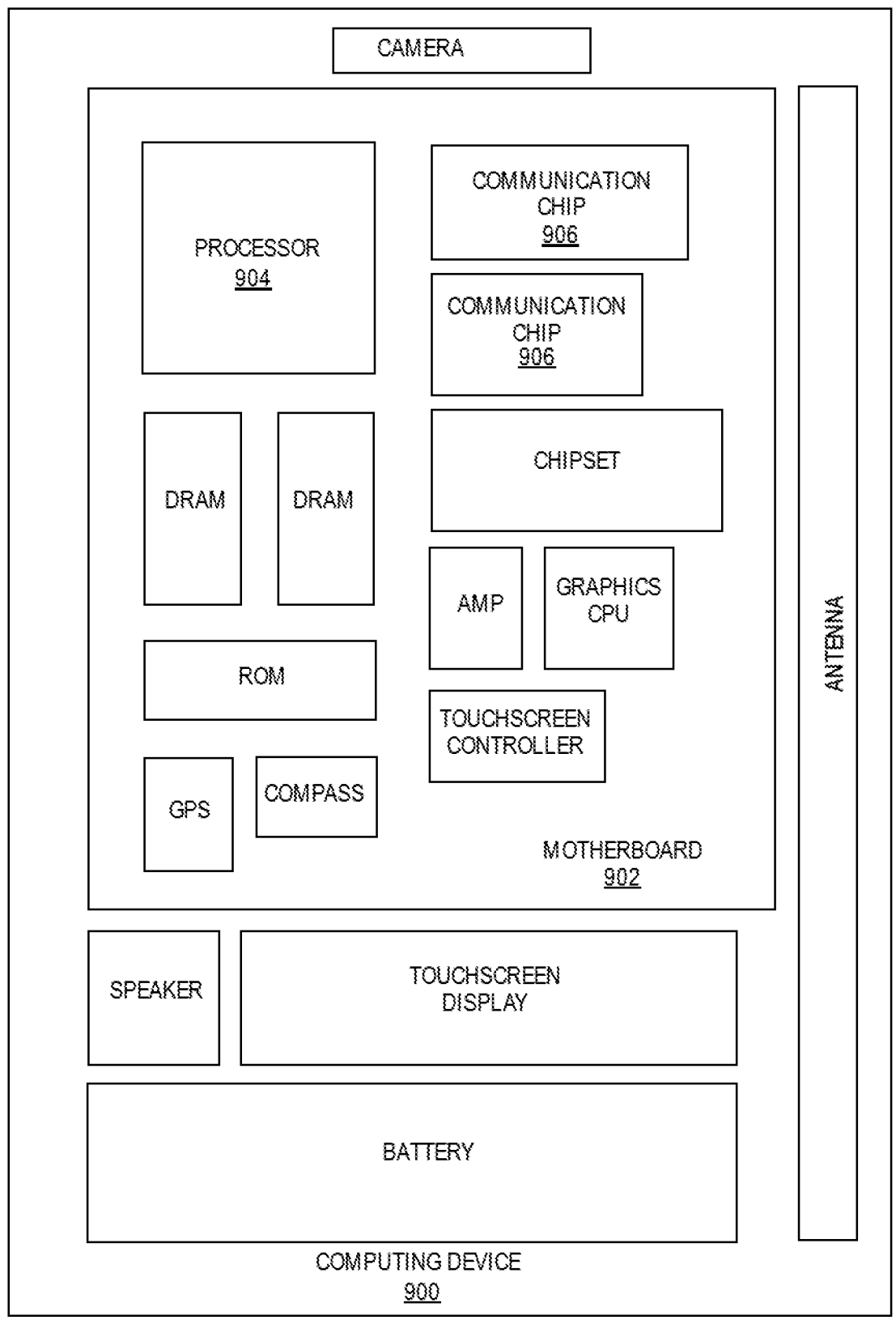
FIG. 9 is a schematic of a computing device built in accordance with an embodiment.

FIG. 9 illustrates a computing device 900 in accordance with one implementation of the invention. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the invention, the integrated circuit die of the processor may be thermally coupled to an integrated heat spreader by a liquid metal thermal interface material, in accordance with embodiments described herein. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of the invention, the integrated circuit die of the communication chip may be thermally coupled to an integrated heat spreader by a liquid metal thermal interface material, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic system, comprising: a package substrate; a die coupled to the package substrate; an integrated heat spreader (IHS) coupled to the package substrate; and a thermal interface pad between the IHS and the die, wherein the die is thermally coupled to the IHS by a liquid metal thermal interface material (TIM) that contacts the thermal interface pad.

Example 2: the electronic system of Example 1, wherein the thermal interface pad is over and in contact with a surface of the die opposing the package substrate.

Example 3: the electronic system of Example 1 or Example 2, wherein the thermal interface pad is over and in contact with a surface of the IHS that faces the die.

Example 4: the electronic system of Examples 1-3, further comprising: a second thermal interface pad, wherein the second thermal interface pad is over and in contact with a surface of the die opposing the package substrate, and wherein the first thermal interface pad is over and in contact with a surface of the IHS that faces the die.

Example 5: the electronic system of Examples 1-4, wherein the liquid metal TIM wets an entire surface of the thermal interface pad.

Example 6: the electronic system of Examples 1-5, wherein the thermal interface pad has a thickness less than 100 μm.

Example 7: the electronic system of Examples 1-6, wherein the thermal interface pad has a thickness less than 50 μm.

Example 8: the electronic system of Examples 1-7, wherein the liquid metal TIM has a melting temperature below 0° C.

Example 9: the electronic system of Examples 1-8, wherein the liquid metal TIM comprises an alloy of two or more elements.

Example 10: the electronic system of Examples 1-9, wherein the thermal interface pad comprises at least one of the elements that comprise the liquid metal TIM.

Example 11: the electronic system of Examples 1-10, wherein the liquid metal TIM comprises gallium, indium, and tin.

Example 12: the electronic system of Examples 1-11, wherein the thermal interface pad comprises indium.

Example 13: an integrated heat spreader (IHS), comprising: a main body; a rim extending out from a first surface of the main body; and a thermal interface pad encircled by the rim, wherein the thermal interface pad is over the main body.

Example 14: the IHS of Example 13, wherein a coating is formed over the main body, and wherein the thermal interface pad is in contact with the coating.

Example 15: the IHS of Example 13 or Example 14, wherein a thickness of the thermal interface pad is less than 100 μm.

Example 16: the IHS of Examples 13-15, wherein the thickness of the thermal interface pad is less than 50 μm.

Example 17: the IHS of Examples 13-16, wherein the rim is non-continuous around the thermal interface pad.

Example 18: the IHS of Examples 13-17, further comprising a plurality of thermal interface pads.

Example 19: the IHS of Examples 13-18, wherein the thermal interface pad is cold-pressed onto the IHS.

Example 20: the method of packaging a die, comprising: attaching a die to a packaging substrate; attaching an integrated heat spreader (IHS) to the packaging substrate, wherein the die is thermally coupled to the IHS by a liquid metal thermal interface material (TIM), wherein the liquid metal TIM wets a thermal interface pad between the die and the IHS.

Example 21: the method of Example 20, wherein the thermal interface pad is on a surface of the die opposing the packaging substrate.

Example 22: the method of Example 20 or Example 21, wherein the liquid metal TIM is applied to the thermal interface pad on the die.

Example 23: the method of Examples 20-22, wherein the thermal interface pad is on a surface of the IHS facing the die.

Example 24: the method of Examples 20-23 wherein the liquid metal TIM is applied onto a surface of the die.

Example 25: the method of Examples 20-24, wherein a second thermal interface pad is on a surface of the die opposing the packaging substrate.

Example 26: an electronic system, comprising: a package substrate; a die coupled to the package substrate; an integrated heat spreader (IHS) coupled to the package substrate; and a thermal interface material (TIM) between the die and the IHS, wherein the TIM comprises a first phase and a second phase.

Example 27: the electronic system of Example 26, wherein the first phase is liquid and the second phase is solid.

Example 28: the electronic system of Example 26 or Example 27, wherein the TIM comprises gallium and indium.

Example 29: the electronic system of Examples 26-28, wherein the TIM comprises at least 20 percent by weight indium.

Example 30: the electronics system of Examples 26-29, wherein the TIM comprises between 20 percent weight indium and 30 percent weight indium.

Example 31: a method of forming an electronic system, comprising: packaging a die to a packaging substrate; placing a solid interface preform over a surface of the die, wherein the solid interface preform has a first melting temperature; forming a thermal interface pad over an integrated heat spreader (IHS), wherein the thermal interface pad has a second melting temperature that is greater than the first melting temperature; attaching the IHS to the packaging substrate, wherein the solid interface preform contacts the thermal interface pad; and melting the solid interface preform.

Example 32: the method of Example 31, wherein the melted solid interface preform alloys with a portion of the thermal interface pad to form a liquid metal thermal interface material (TIM).

Example 33: the method of Example 31 or Example 32, wherein the thermal interface pad is not entirely consumed during the melting process.

Example 34: the method of Examples 31-33, wherein the liquid metal TIM comprises less than 20% by weight the thermal interface pad material.

Example 35: the method of Examples 31-34, further comprising: melting the thermal interface pad, wherein the thermal interface pad and the solid interface preform alloy to form a liquid metal TIM.

Example 36: the method of Examples 31-35, wherein the liquid metal TIM is at least 20% by weight the thermal interface pad material.

Example 37: the method of Examples 31-36, wherein the liquid metal TIM comprises a first phase and a second phase.

Example 38: the method of Examples 31-37, wherein the first phase is liquid and the second phase is solid.

Example 39: the method of Examples 31-38, wherein the solid interface preform comprises gallium, and wherein the thermal interface pad comprises indium.

Example 40: the method of Examples 31-39, wherein the melting is implemented at above 158° C.

Example 41: the method of Examples 31-40, wherein the liquid metal TIM comprises between 20 and 30 percent by weight indium.

What is claimed is:

1. An electronic system, comprising:
a package substrate;
a die coupled to the package substrate;
an integrated heat spreader (IHS) coupled to the package substrate; and
a thermal interface pad between the IHS and the die, wherein the die is thermally coupled to the IHS by a liquid metal thermal interface material (TIM) that contacts the thermal interface pad, wherein the thermal interface pad comprises at least one of the elements that comprise the liquid metal TIM, and wherein the TIM comprises between 20 percent weight indium and 30 percent weight indium.

2. The electronic system of claim 1, wherein the thermal interface pad is over and in contact with a surface of the die opposing the package substrate.

3. The electronic system of claim 1, wherein the thermal interface pad is over and in contact with a surface of the IHS that faces the die.

4. The electronic system of claim 1, further comprising:
a second thermal interface pad, wherein the second thermal interface pad is over and in contact with a surface of the die opposing the package substrate, and wherein the thermal interface pad is over and in contact with a surface of the IHS that faces the die.

5. The electronic system of claim 1, wherein the liquid metal TIM wets an entire surface of the thermal interface pad.

6. The electronic system of claim 1, wherein the thermal interface pad has a thickness less than 100 μm.

7. The electronic system of claim 1, wherein the thermal interface pad has a thickness less than 50 μm.

8. The electronic system of claim 1, wherein the liquid metal TIM has a melting temperature below 0° C.

9. The electronic system of claim 1, wherein the liquid metal TIM comprises an alloy of two or more elements.

10. The electronic system of claim 9, wherein the liquid metal TIM comprises gallium, indium, and tin.

11. The electronic system of claim 10, wherein the thermal interface pad comprises indium.

12. An integrated heat spreader (IHS), comprising:
a main body;
a rim extending out from a first surface of the main body; and
a thermal interface pad encircled by the rim, wherein the thermal interface pad is over the main body, wherein the thermal interface pad comprises at least one of the elements that comprise a liquid metal TIM on the thermal interface pad, and wherein the TIM comprises between 20 percent weight indium and 30 percent weight indium.

13. The IHS of claim 12, wherein a coating is formed over the main body, and wherein the thermal interface pad is in contact with the coating.

14. The IHS of claim 12, wherein a thickness of the thermal interface pad is less than 100 μm.

15. The IHS of claim 14, wherein the thickness of the thermal interface pad is less than 50 μm.

16. The IHS of claim 12, wherein the rim is non-continuous around the thermal interface pad.

17. The IHS of claim 12, further comprising a plurality of thermal interface pads.

18. The IHS of claim 12, wherein the thermal interface pad is cold-pressed onto the IHS.

19. An electronic system, comprising:
a package substrate;
a die coupled to the package substrate;
an integrated heat spreader (IHS) coupled to the package substrate; and
a thermal interface material (TIM) between the die and the IHS, wherein the TIM comprises a first phase and a second phase, wherein the thermal interface pad comprises at least one of the elements that comprise the TIM, and wherein the TIM comprises between 20 percent weight indium and 30 percent weight indium.

20. The electronic system of claim 19, wherein the first phase is liquid and the second phase is solid.

21. The electronic system of claim 19, wherein the TIM comprises gallium and indium.

22. An electronic system, comprising:
a package substrate;
a die coupled to the package substrate;
an integrated heat spreader (IHS) coupled to the package substrate; and
a thermal interface material (TIM) between the die and the IHS, wherein the TIM comprises a first phase and a second phase, wherein the TIM comprises gallium and indium, and wherein the TIM comprises between 20 percent weight indium and 30 percent weight indium.

* * * * *